US006737857B2

(12) United States Patent
Babcock (10) Patent No.: US 6,737,857 B2
(45) Date of Patent: May 18, 2004

(54) APPARATUS AND METHOD FOR DRIVING CIRCUIT PINS IN A CIRCUIT TESTING SYSTEM

(75) Inventor: Douglas W. Babcock, Manchester, NH (US)

(73) Assignee: Analog Devices, Inc., Norwood, MA (US)

( * ) Notice: Subject to any disclaimer, the term of this patent is extended or adjusted under 35 U.S.C. 154(b) by 79 days.

(21) Appl. No.: 10/044,501

(22) Filed: Jan. 10, 2002

(65) Prior Publication Data

US 2002/0093359 A1 Jul. 18, 2002

Related U.S. Application Data

(63) Continuation-in-part of application No. 09/757,746, filed on Jan. 10, 2001.
(60) Provisional application No. 60/265,729, filed on Feb. 1, 2001, and provisional application No. 60/267,162, filed on Feb. 7, 2001.

(51) Int. Cl.$^7$ ............................................... G01R 31/28
(52) U.S. Cl. .................................... 324/158.1; 324/765
(58) Field of Search ............................ 324/73.1, 158.1, 324/763; 702/765, 124; 714/738, 733, 724

(56) References Cited

U.S. PATENT DOCUMENTS

| 5,146,159 A | 9/1992 | Lau et al. |
| 5,377,202 A | 12/1994 | Bryson et al. |
| 5,461,310 A | * 10/1995 | Cheung et al. .......... 324/158.1 |
| 5,842,155 A | 11/1998 | Bryson et al. |
| 5,942,922 A | * 8/1999 | Dinteman et al. .......... 327/108 |
| 6,057,716 A | * 5/2000 | Dinteman et al. .......... 327/108 |
| 6,166,569 A | 12/2000 | McQuilkin |

FOREIGN PATENT DOCUMENTS

| WO | WO 99/52203 | 10/1999 |
| WO | WO 00/39928 | 7/2000 |

* cited by examiner

*Primary Examiner*—Vinh P. Nguyen
(74) *Attorney, Agent, or Firm*—Gauthier & Connors LLP (57) ABSTRACT

A circuit testing apparatus for testing a circuit under test. The circuit testing apparatus includes a controller for controlling signals being transferred between a circuit under test and the circuit testing apparatus. The circuit testing apparatus further includes a driver circuit for generating signals to be applied to the circuit under test. The driver includes a high speed slave chain and DC control loop chain coupled to the circuit under test. The high speed slave chain receives a differential voltage logic pulse train and converts the logic pulse train into a high speed current steering for producing the drive signal to be applied to the circuit under test. The DC control loop chain provides feedback paths for DC regulation of inputs of the high speed slave chain.

44 Claims, 9 Drawing Sheets

APPARATUS AND METHOD FOR DRIVING CIRCUIT PINS IN A CIRCUIT TESTING SYSTEM

PRIORITY INFORMATION

This application is a continuation-in-part of Ser. No. 09/757,746 filed Jan. 10, 2001, and claims priority from provisional applications Ser. No. 60/265,729 filed Feb. 1, 2001 and Ser. No. 60/267,162 filed Feb. 7, 2001.

BACKGROUND OF THE INVENTION

In the integrated circuit industry, it is common practice to test finished ICs before they are shipped to users. To ensure efficiency and low cost, the ICs are typically tested automatically by systems that are collectively referred to as automatic test equipment (ATE). A typical ATE system for testing a finished IC includes a control system such as a personal computer programmed to run tests and process and store test result data automatically. The system also includes various power sources used to power the IC under test and to generate any test signals required for the tests. These can typically include DC as well as AC sources. The system also includes a "test head" in which the IC is mounted for the test. The test head typically includes a device interface board (DIB) that provides the appropriate electronic interface between the IC under test and the rest of the test system. The DIB typically makes connections to the IC via the connection pins on the IC package. Test stimulus signals generated by the test system are applied to the appropriate IC inputs and resulting response signals from the IC outputs are coupled to the test system via the DIB connections to the IC pins.

In present technology, ICs operate at extremely high speed and with very small voltage and power variation tolerances. As a result, the signals used in an ATE system to stimulate an IC under test must also be generated with extreme accuracy and precision. Signal voltage levels must be held to very close tolerances, and signals must be generated to operate at extremely high speed with very close timing tolerances. In addition, the quality of time varying test signals must be very carefully controlled. For example, when testing a digital circuit, it is often desirable to generate a train of square pulses to be applied to the circuit. Because of the high-speed and low-voltage requirements of present digital circuits, the various attributes of the square pulses, such as rise and fall times, duty cycle, symmetry, overshoot, undershoot, etc., must be controlled very accurately.

To generate these various test signals from the power supply outputs, and to accurately process resulting output response signals from the circuit under test, an ATE system typically also includes additional circuitry between the controlling processor and the DIB. This circuitry, commonly referred to as "pin electronics," includes driving circuitry for generating the stimulus signals to be applied to the IC input pins and receiving and detection circuitry for processing response signals from the IC output pins.

Conventional pin driver circuits exhibit various drawbacks when they are called upon to generate the highly accurate stimulus signals required by present high-speed circuits. For example, conventional amplification stages which require current to switch on and off to generate square pulses cannot generate short pulses with symmetry, i.e., substantially equal rise and fall times.

SUMMARY OF THE INVENTION

The present invention is directed to a circuit testing apparatus and method that provides circuit testing drive signals with extremely accurate timing and voltage parameters and which exhibit a high level of pulse symmetry. The circuit testing apparatus of the invention includes a controller that controls signals being transferred between the circuit under test and the circuit testing apparatus. A driver circuit in the circuit testing apparatus generates signals to be applied to the circuit under test. The driver circuit includes a high speed slave chain and a DC control loop chain to the circuit under test.

The driver circuit is coupled to a pin on the circuit under test. In general, the pin electronics can include a separate driver circuit for each pin on the circuit under test, with a driver circuit being coupled to each pin, such that separately generated and controllable drive signals can be applied to each pin.

According to one aspect of the present invention, a circuit testing apparatus is provided. The circuit testing apparatus includes a controller for controlling signals being transferred between a circuit under test and the circuit testing apparatus. The circuit testing apparatus further includes a driver circuit for generating signals to be applied to the circuit under test. The driver includes a high speed slave chain and DC control loop chain coupled to the circuit under test. The high speed slave chain receives a differential voltage logic pulse train and converts the logic pulse train into a high speed current steering for producing the drive signal to be applied to the circuit under test. The DC control loop chain provides feedback paths for DC regulation of inputs of the high speed slave chain.

According to another aspect of the present invention, a circuit testing apparatus is provided. The circuit testing apparatus includes a controller for controlling signals being transferred between a circuit under test and the circuit testing apparatus. The circuit testing apparatus further includes a driver means for generating signals to be applied to the circuit under test. The driver includes a high speed slave chain and DC control loop chain coupled to the circuit under test. The high speed slave chain receives a differential voltage logic pulse train and converts the logic pulse train into a high speed current steering for producing the drive signal to be applied to the circuit under test. The DC control loop chain provides feedback paths for DC regulation of inputs of the high speed slave chain.

According to another aspect of the present invention, a method of testing a circuit is provided. The method includes providing a controller for controlling signals being transferred to and from the circuit under test. The method also includes providing a driver circuit coupled to the circuit under test. The method further includes receiving a differential logic pulse train, and converting the logic pulse train into a high speed current steering for producing the drive signal to be applied to the circuit under test.

BRIEF DESCRIPTION OF THE DRAWINGS

The foregoing and other objects, features, and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 1:
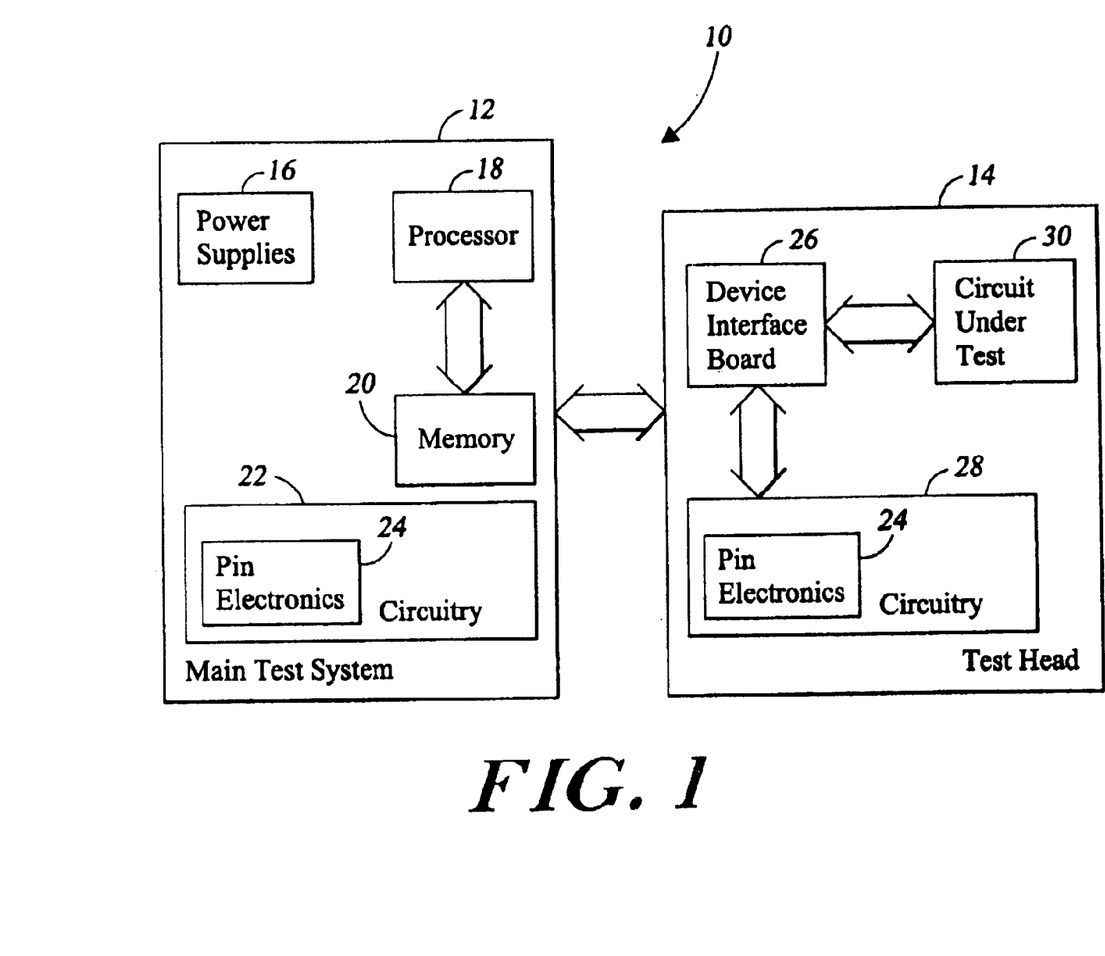
FIG. 1 contains a schematic block diagram of one embodiment of a circuit testing system in accordance with the present invention.

FIG. 1 contains a schematic block diagram of one embodiment of a circuit testing system 10 in accordance with the present invention. The system 10 includes a main test system or console 12 interfaced to a test head 14. The console 12 includes a controller or processor 18 and memory 20 which can be implemented in, for example, a personal computer. The processor 18 runs under the control of a program stored in the memory 20 for automatically testing a circuit under test 30 mounted in the test head 14. The processor 18 and memory 20 control virtually all aspects of the tests being performed including the timing and levels of DC and time varying stimulus signals applied to the circuit under test. The processor 18 and memory 20 also process and store data for response signals transferred by the circuit under test 30 to the console 12 in response to the stimulus signals. The console 12 also includes multiple power supplies 16 used for providing power to the circuit under test 30 during testing and also provides the stimulus signals applied to the circuit under test 30 during testing. The console 12 also includes electronic circuitry 22 designed and implemented according to the particular circuit under test 30 and the particular tests being performed. The circuitry 22 can include the pin electronics 24 used to interface with the pins on the circuit under test 30 in accordance with the invention. As shown in FIG. 1, in an alternative embodiment, the pin electronics 24 are implemented in the test head 14. It will be understood that the pin electronics 24 are not implemented in both the console 12 and the test head 14 but are illustrated in both places in FIG. 1 merely to illustrate that the location of the pin electronics is not limited to only one of the possible locations.

As mentioned above, the circuit under test 30 is mounted in the test head 14 during testing. The circuit under test 30 can be any type of circuit or integrated circuit such as a microprocessor circuit. The pin electronics 24 interface with the circuit under test 30 via a device interface board 26 to apply stimulus signals to, and receive response signals from, the circuit under test 30. The device interface board 26 includes interconnections between the pin electronics 24 and the pins on the package of the circuit under test 30 as well as the electronics used to facilitate the interconnections, e.g., filtering circuitry. The device interface board 26 also includes the mechanical interface to the package pins on the circuit 30. When the circuit 30 is held in place in a socket on the device interface board 26, connections are made to the pins on the circuit 30 to complete the interface between the system 10 and the circuit 30. The pin electronics 24 are shown in FIG. 1 as part of electronic circuitry 28. Like the circuitry 22 in the console 12, the circuitry 28 refers to electronic circuitry required to perform the particular required tests on the particular circuit being tested. This can be, for example, amplification circuitry, signal conditioning circuitry, filtering circuitry, etc.

Figure 2:
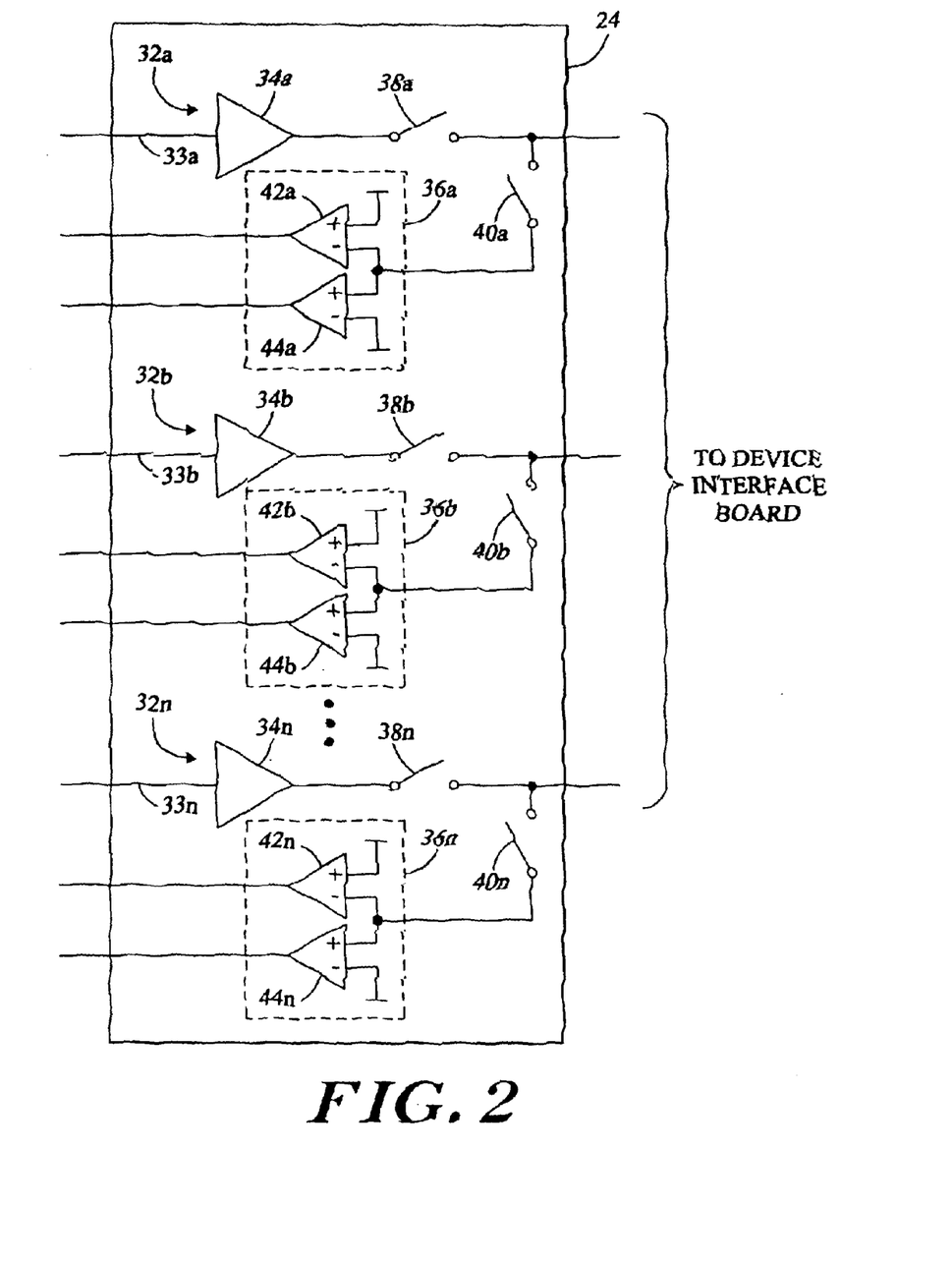
FIG. 2 contains a schematic block diagram of one embodiment of pin electronics in the circuit testing system in accordance with the present invention.

FIG. 2 is a schematic block diagram illustrating the general configuration of one embodiment of the pin electronics 24 in accordance with the invention. The pin electronics include a receiver/driver circuit 32a, 32b, ..., 32n for each pin in the circuit under test 30 to which a connection is to be made by the test system. Each receiver/driver circuit 32 includes a pin driver circuit 34 and a receiver circuit 36 coupled together to a line that is coupled to the circuit under test via the device interface board 26. Each pin driver 34 is coupled to the line via an electronic switch 38 that allows the driver 34 to be electrically disconnected from the line when the line is being used to receive signals from the circuit under test. Each receiver circuit 36 is also coupled to the line via an electronic switch 40 that allows the receiver 36 to be electrically disconnected from the line when the line is being used to apply a drive signal to the circuit under test.

Each receiver circuit 36 can include a window comparator circuit formed from a pair of comparators 42 and 44 connected together as shown. In each window comparator circuit, an upper threshold voltage is applied to the noninverting input of the comparator 42 and a lower threshold voltage is applied to the inverting input of the comparator 44. The outputs of the comparators are coupled to the test system for analysis. The timing of state changes in the comparator outputs can be used to analyze a signal received from the associated output of the circuit under test.

The pin driver circuits 34 receive a signal on an input line 33 from the controlling processor 18 that defines the signal that is to be generated and applied to the circuit under test by the driver 34. For example, the signal received on the line 33 can be a square wave which transitions between a logic high level and a logic low level at a particular frequency, duty cycle, etc., determined to be appropriate for the particular test. In response, the pin driver 34 must generate a stimulus signal in accordance with the parameters of the controlling signal for application to the circuit under test.

Figure 3:
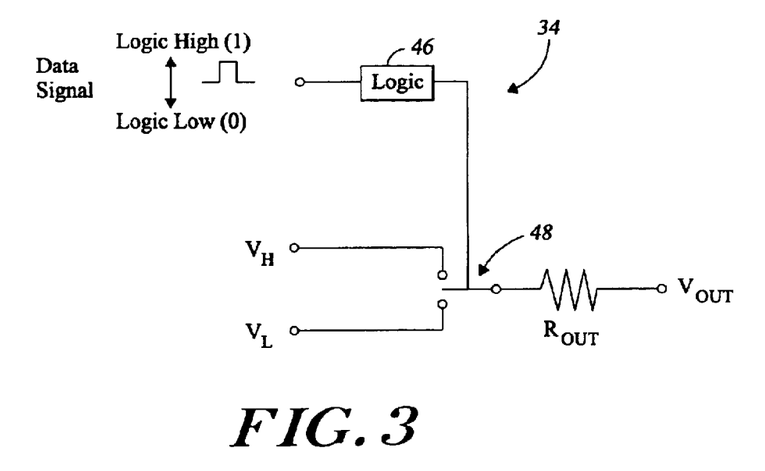
FIG. 3 is a schematic diagram illustrating the logical function of pin electronics in accordance with the invention.

FIG. 3 is a schematic block diagram that illustrates the logical function of the pin driver circuit 34. The controlling data signal which defines the parameters of the desired output drive signal is applied to input logic circuitry 46. The signal in general can transition between logic low and high levels and can be characterized by a number of signal parameters, e.g., pulse rise and fall times, pulse symmetry, pulse duration, square wave duty cycle, etc. The control signal is applied to logic 46 that is used to control switching of a switching means 48. The switching means 48 effectively generates a stimulus signal that is compatible with the circuit under test and which complies as closely as possible with the signal parameters defined by the data control signal applied to the logic 46. That is, as the control signal transitions between its logic high and low states, the switching means 48 applies signal levels compatible with the circuit under test. For example, when the control signal is in a logic high state, the switching means 48 is configured to apply a drive signal at a high voltage level referred to herein as $V_H$. Likewise, when the control signal is in a logic low state, the switching means 48 is configured to apply a drive signal at a low voltage level referred to herein as $V_L$. These voltages are applied through an output resistance $R_{OUT}$ to generate the drive signal voltage level $V_{OUT}$ to be applied as a stimulus to the circuit under test.

To generate the drive signal for application to the circuit under test with the desired voltage level and timing accuracy, as well as signal quality and fidelity, the driver circuit 34, and particularly the switching means 48, are actually implemented with amplification and signal conditioning circuitry designed to meet the drive signal requirements. However, as circuits being tested have become faster and more dense, the accuracy requirements for drive signals have become extremely challenging to meet. Driver circuits used in conventional testing systems are becoming increasingly incapable of meeting these increasingly stringent drive signal requirements.

For example, one conventional type of driver uses a class AB output stage that operates in class A conditions at low output currents and class B conditions when an output device shuts off due to higher output currents. These class AB drivers offer a high degree of functionality including high voltage swing capability and relatively low power, but they also suffer from a number of limitations when ultimate speed and accuracy are required. In particular these limitations are due to the fact that current flowing through the output transistor string is allowed to be shut off in at least one of the transistors.

Another conventional type of driver is referred to as a class A driver. Class A drivers operate at higher power levels than AB drivers, and their output swings are generally lower. Class A drivers operate faster and more accurately than AB drivers. Class A drivers provide for an output voltage swing that occurs as a current is either allowed to pass or not allowed to pass through its output resistor. That is, the driver transitions between two states, one in which current flows through the output resistor and one in which the current is shut off. Under high-speed dynamic conditions, output transistors are being switched on and off very quickly to switch the current through the output resistance between on and off. A problem arises in this situation due to the fact that the transistors turn on very differently than they turn off. Accordingly, there is a marked difference in the two switching situations, i.e., on-to-off and off-to-on, in the current flow through the output resistance. As a result, the output waveform can exhibit a large amount of asymmetry. In particular, when a transistor is switched on and off, the rising edge of the output pulse will not have the same characteristics as the falling edge. This is generally due to junction capacitance and stored charge in the transistors as they are made to switch on and off. Thus, in these types of circuits, transistors can be made to switch on and off very quickly, but not accurately enough to accommodate next-generation testing.

Figure 4:
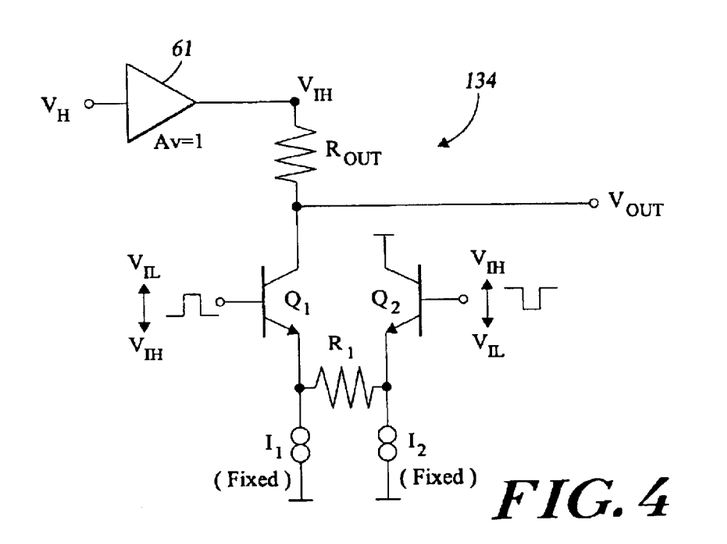
FIG. 4 is a schematic diagram of one embodiment of a portion of a pin driver circuit in accordance with the invention.

FIG. 4 contains a schematic diagram of one embodiment of a portion of a pin driver circuit 134 in accordance with the invention that addresses these problems of conventional pin driver circuits. The pin driver circuit 134 includes a differential pair of transistors Q1 and Q2 connected as shown. Each emitter leg includes a current source value $I_1$ and $I_2$, each of which is set at a fixed current. A gain degeneration resistor R1 is connected between the emitters of the transistors Q1 and Q2 such that the configuration performs as a linear amplifier instead of the switched circuits used in the prior art systems.

In the circuit 134 of FIG. 4, the current through the leg of the circuit that contains the transistor Q1, and, therefore, the current through the output resistor $R_{OUT}$, determines the output voltage level $V_{OUT}$ generated by the driver circuit output stage. The resistance values R1 and $R_{OUT}$ are selected such that the voltage drop across the output resistance $R_{OUT}$ sets the output voltage $V_{OUT}$ of the drive signal to the desired levels. The amount of current flowing through the transistor Q1 is controlled in turn by the amount of current flowing through the resistor R1. When the voltage on the emitter of Q2 is higher than that of Q1, then current flows from the Q2 side of R1 to the Q1 side of R1. With the current $I_1$ set at an appropriate level, a relatively small amount of current flows through Q1 and $R_{OUT}$, and the output voltage $V_{OUT}$ is at a high level. When the voltage on the emitter of Q2 is lower than that of Q1, then current flows through R1 from the Q1 side to the Q2 side of R1. A relatively high level of current flows through Q1 and $R_{OUT}$, and the output voltage level $V_{OUT}$ is at a low level. Thus, by controlling the amount of current through the resistor R1, the level of the output voltage $V_{OUT}$ is controlled.

The current through R1 is controlled by the voltage levels on the emitters of Q1 and Q2. These are determined by the controlling input signal provided at the base inputs of the differential-input pair Q1 and Q2. This differential-input signal, which for this description takes the form of a square pulse or some combination of square pulses, transitions between a low level input voltage $V_{IL}$ and a high level input voltage $V_{IH}$. When the Q1 base is at the high level $V_{IH}$ and the Q2 base is at the low level $V_{IL}$, current flows through R1 from the Q1 side to the Q2 side and the output voltage $V_{OUT}$ is at a low level $V_L$. Likewise, when the Q1 input is at the low level $V_{IL}$ and the Q2 base is at the high level $V_{IH}$, current flows through R1 from the Q2 side to the Q1 side and the output voltage $V_{OUT}$ is at a high level. The low and high output levels are also determined by the selection of the output resistance $R_{OUT}$. The high level output drive voltage $V_H$ is applied to $R_{OUT}$ by a unity gain amplifier 61. The value of $R_{OUT}$ is selected such that when the higher current flows through $R_{OUT}$, the output voltage $V_{OUT}$ is at the desired low output voltage value, and when the lower current flows through $R_{OUT}$, the output voltage $V_{OUT}$ is at the desired high output voltage value.

The currents $I_1$ and $I_2$ set by their respective current sources are chosen to be at levels compatible with the resistances R1 and $R_{OUT}$ and, in one embodiment, are set to an equal fixed current. That is, in one embodiment, $I_1$ and $I_2$ are fixed, and $I_1=I_2$. The currents $I_1$ and $I_2$ are chosen such that regardless of the direction of current flow through R1, both transistors Q1 and Q2 are conducting some current, i.e., neither transistor is completely shut off, and the difference in current between the two states flowing through $R_{OUT}$ determines the voltage swing of the output $V_{OUT}$. For example, if $R_{OUT}$ is 50 ohms, and the difference in current through Q1 in the low state and the high state is 20 ma, then the difference between the high and low levels of $V_{OUT}$ will be 1.0 volt.

The operation of the circuit of FIG. 4 will now be illustrated by example circuit parameters. It will be understood that these parameters are used only to illustrate the invention and are not limiting. Other circuit parameters can be used within the scope of the invention.

Assuming that it is desired to set the output voltage $V_{OUT}$ to swing between 0 and 1.0 volt and $R_{OUT}$ is 50 ohms, the difference in current through $R_{OUT}$ between states should be set to 20 ma. The source currents $I_1$ and $I_2$ can each be set to 12 ma and R1 can be chosen to be 50 ohms. The voltage $V_H$ at the top of $R_{OUT}$ is set to 1.1 volts. The differential input signal can be controlled such that the base or Q1 is −0.5 and the base of Q2 is 0 volt. In this configuration, the current through $R_{OUT}$ in the high output state is 2 ma, resulting in a 0.1 volt drop across $R_{OUT}$ such that $V_{OUT}$ is 1.0 volt. The current through $R_{OUT}$ in the low output state is 22 ma, resulting in a 1.1 volt drop across $R_{OUT}$ such that $V_{OUT}$ is 0.0 volt.

To illustrate this, when the Q1 base is at 0 volt and the Q2 base is at −0.5 volt, the emitters of Q1 and Q2 are at approximately −0.7 and −1.2 volt, respectively. Current at a level of 10 ma flows in R1 from the Q1 side to the Q2 side, resulting in a total current in Q1 and $R_{OUT}$ of 12+10=22 ma. The current through Q2 is at 12−10=2 ma. The 22 ma current through $R_{OUT}$ results in a 1.1 volt drop across $R_{OUT}$, or a $V_{OUT}$ of 0.0 volt. When the Q1 base is at −0.5 volt and the Q2 base is at 0 volt, the emitters of Q1 and Q2 are at approximately −1.2 and −0.7 volt, respectively. Current at a level of 10 ma flows in R1 from the Q2 side to the Q1 side, resulting in a total current in Q1 and $R_{OUT}$ of 12−10=2 ma. The current through Q2 is at 12+10=22 ma. The 2 ma current through $R_{OUT}$ results in a 0.1 volt drop across $R_{OUT}$, or a $V_{OUT}$ of 1.0 volt.

Hence, unlike the switched circuits in prior systems, the linear circuit of the invention uses fixed current sources and controls the output swing by varying the base differential voltage of Q1 and Q2. The source currents and resistance R1 are chosen such that the operation of the device never results in either transistor being shut off. Keeping both devices on all the time eliminates the stored charge problem found in prior devices. Also, controlling the output level by varying the base voltages allows the circuit of the invention to operate at acceptable output voltage levels with relatively small input voltage levels. These factors provide the capability of generating very fast and accurate stimulus signals with very high fidelity and signal quality.

Figure 5:
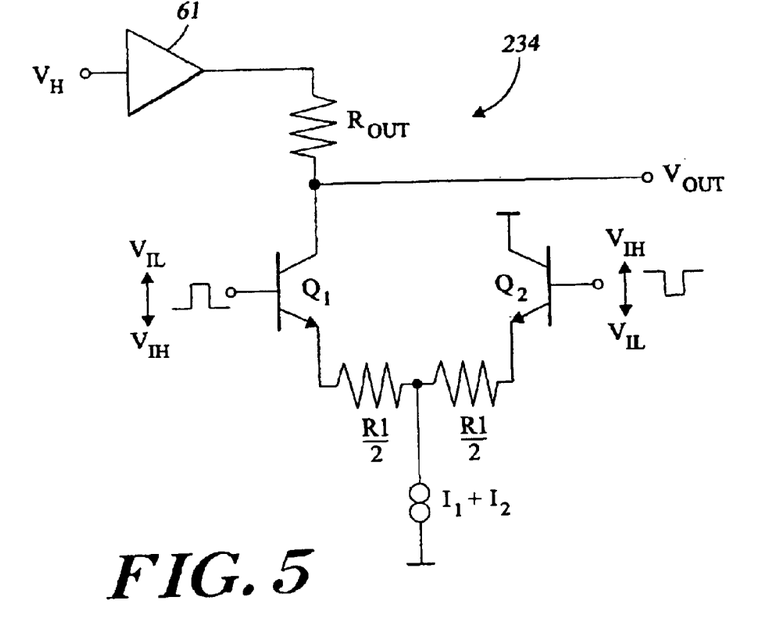
FIG. 5 is a schematic diagram of an alternative embodiment of a portion of a pin driver circuit in accordance with the invention.

FIG. 5 is a schematic diagram of an alternative embodiment of a portion of a pin driver circuit 234 in accordance with the invention. In this embodiment, the resistance R1 of the previous embodiment is implemented as two resistors connected as shown, each having a value of R½. Also, the dual current sources $I_1$ and $I_2$ of the previous embodiment are implemented as a single current source having a current value of $I_1+I_2$. This circuit functions in a similar fashion to the circuit shown in FIG. 4.

Figure 6:
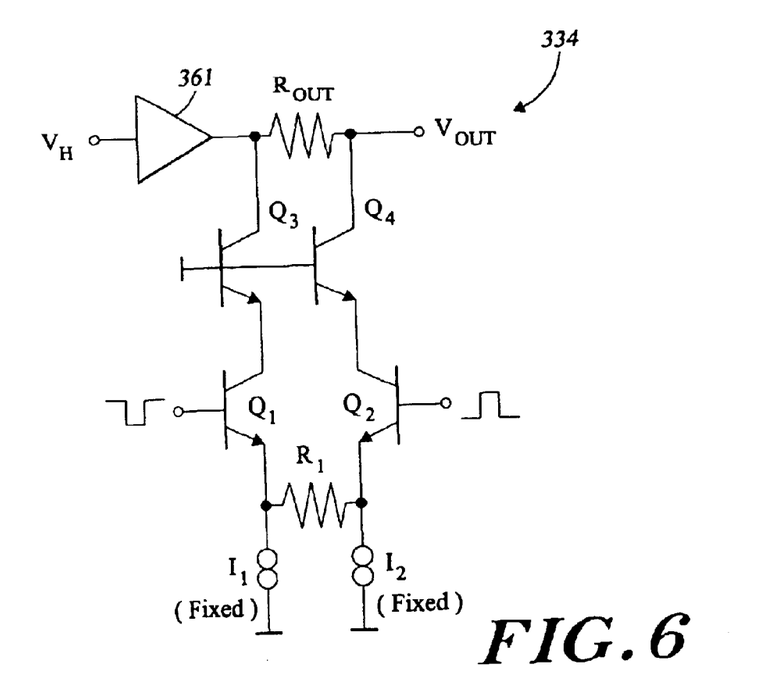
FIG. 6 is a schematic diagram of another alternative embodiment of a portion of a pin driver circuit in accordance with the invention.

FIG. 6 is a schematic diagram of another alternative embodiment of a portion of a pin driver circuit 334 in accordance with the invention. In this embodiment, the circuit includes cascode transistors Q3 and Q4 as well as a connection point for the unused current that flows through Q2 and Q4. This causes the total current sourced by the $V_H$ voltage source 361 to be constant regardless of output voltage $V_{OUT}$ amplitude. From a DC point of view, this keeps the output resistance of the $V_H$ buffer amplifier 361 constant which in turn reduces interaction between the high and low output voltage levels caused by changes in output swing level. From a dynamic point of view, the buffer 361 sees very small transient current spikes rather than large current transitions. The cascode transistors Q3 and Q4 also improve output stage bandwidth by keeping the collectors of Q1 and Q2 at constant voltages. The $V_H$ voltage source used in one embodiment can be a class AB style driver.

It is noted that the foregoing describes the circuit of the invention as including a differential input in which the difference between the input voltages is used to operate the circuit. However, it will be understood that a single-ended input can also be used in accordance with the invention. That is, one of the inputs can be held at a constant voltage while the other is varied to control the input to the circuit.

Figure 7:
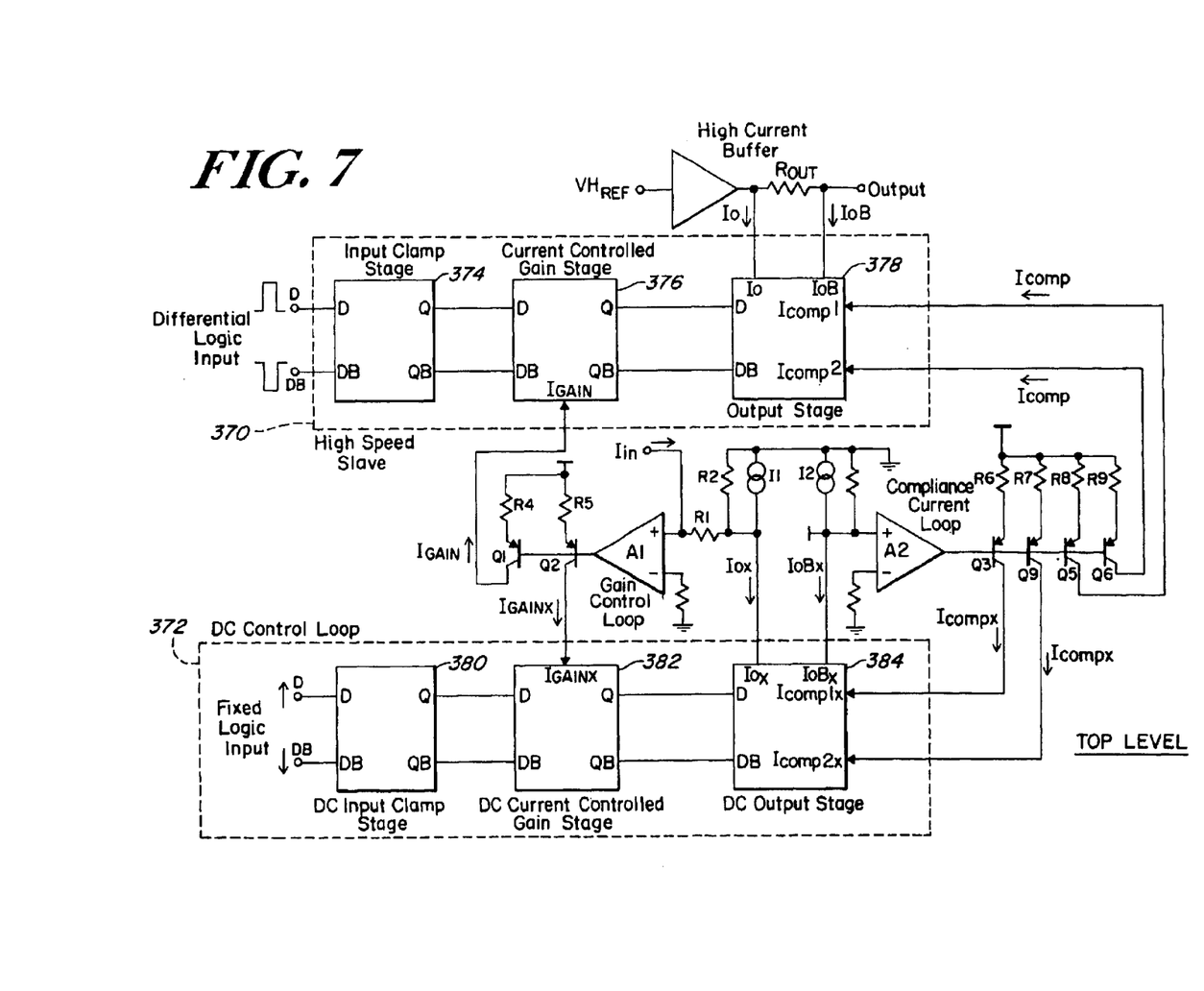
FIG. 7 is a schematic diagram of the top level of an implementation of the pin driver circuitry.

FIG. 7 illustrates the top level of an implementation of the pin driver circuitry. In particular, on the top center of FIG. 7 is a high current amplifier that has its output resistor Rout equal to 50 Ohm, which is similar to characteristic impedance of the transmission line path to the Device Under Test (DUT) pin that the output node connects to. The high current amplifier receives as input the voltage $V_{HREF}$. Differential output currents Io and IoB leave at both the respective terminals of resistor Rout such that when the current Io is greater than current IoB, the voltage at the output is said to be in a logical high state or, VH. When the output Io is less than the current IoB, the voltage at the output is said to be in a logical low state or, VL.

The high current buffer arrangement is provided for illustrative purposes to show one of many arrangements where the inventive circuit may be used. The high current buffer's input voltage level, $V_{HREF}$, as well as the sum and difference of currents, Io and IoB, both common mode and differential output voltages may be programmed. The buffer arrangement is usually unity gain that provides high current and low impedance output. The output node is usually connected to a 50 Ohm transmission line and is terminated at 50 Ohms at the DUT pin. The buffer supplies in excess of 50 mA when the driver is programmed for an output pulse of 1 V in amplitude.

The pin driver also includes a high speed slave (HSS) chain 370 and DC control loop (DCCL) chain 372. The high speed slave (HSS) chain 370 provides the functionality to convert an input differential voltage logic pulse train into the high current steering of outputs Io and IoB. The HSS chain 370 requires two logic inputs D and DB to take the form of an ECL level complimentary signal, such that D is at a logical high and DB will be at a logical low. These input pulse signals amplitudes are on the order of 0.5V peak to peak, with the high logic levels at approximately −0.8 V and logic low levels at approximately −1.3 V. The pin driver, when fabricated using ADI's XF2 semiconductor process can handle input pulse repetition rates upward of 2 GHz. When input D is high and DB is low, output current Io will be greater than output current IoB causing the output voltage of the pin driver to be high. When the input D is low and input DB is high, the output current IoB will be greater than that of the output current Io and the output to the pin driver will be low. The HSS chain 370 includes an input clamp stage 374, current controlled gain stage 376, and output stage 378. The input pulse signals D and DB are presented to the input clamp stage of the HSS chain 370. The input clamp stage 378 converts these signals into differential ramps that are clamped at their fixed amplitude levels. The input clamp stage 378 provides differential outputs Q and QB that are highly accurate and linear slew rate transitions of a fixed amplitude. The input clamp stage 378 directs the outputs Q and QB as inputs D and DB to the current control gain stage 376. The input current signal $I_{GAIN}$ adjusts these fixed amplitude levels.

In particular, the current controlled gain stage 376 (CCGS) provides a time invariant output at its outputs Q and QB, where the amplitude is adjusted from essentially 0 to maximum voltage by means of DC current injected into the $I_{GAIN}$ port. The outputs of the CCGS 376 Q and QB are directed as inputs D and DB to the output stage 378. The outputs of the CCGS 378 Q and QB provide controlled amplitude differential voltage pulses to the output stage. The output stage drives a linear differential fixed Gm stage that outputs high currents Io and IoB. The HSS chain 370 has two control mechanisms. They are the $I_{GAIN}$ input to the gain stage that sets the difference between Io and IoB output currents and the Icomp1 and Icomp2 inputs to the output stage that control the sum of the Io and IoB currents. Thus, given a fixed voltage and output resistance from the high current buffer arrangement, both the VH and VL output voltage levels may be controlled.

The DC control loop (DCCL) chain 372 is essentially identical in its circuit configuration to the high speed slave chain (HSS) 370. The DC control loop (DCCL) chain 372 is used solely to provide a closed loop DC regulation for the high speed slave chain 370 via its $I_{GAIN}$, Icomp1 and Icomp2. The DCCL chain 372 includes a DC input clamp stage 380, DC current controlled gain stage 382 and DC output stage 384. These various stages perform similar functions to their high speed slave chain 370 counterpart. One of the differences between the high speed slave chain 370 and the DC control loop chain 372 is that the high speed slave chain 370 accepts high speed differential inputs D and DB from a logic source where the DC control loop chain 372 inputs remains fixed, logic wise. Another difference is that the internal circuitry of the high speed slave chain 370 is ratio-matched to the internal components of the DC control loop chain 372. For illustrative purposes, the currents and device sizes in the high speed slave chain 370 are 10 times the size of their counterparts in the DC control loop chain 372. The DC control loop chain 372 provides low speed feedback paths for amplifiers A1, A2 and their associated circuitry via respective $I_{GAINX}$, Icomp1× and Icomp2× inputs, wherein the Slave chain receives exactly proportional scaled control currents via its $I_{GAIN}$, Icomp1 and Icomp2 inputs.

The output differential currents Iox and IoBx are controlled by sourcing a current into the $I_{in}$ port. This value realized 0 to maximum output current differential when $I_{in}$ current was adjusted from 0 to 1 mA. This current may be generated by a DAC with an output voltage of 0 Volts. With the input D of the DC input clamp stage fixed with a logical value of high and the other differential input DB set at a logical value of low, the DCCL chain 372 output Iox will always be greater than or equal to output IoBx of the DC control loop chain 372. If $I_{in}$ is set to 0 mA, DCCL chain 372 outputs Iox and IoBx will become equal. Otherwise, if $I_{in}$ is set higher than 0 mA, Iox will be proportionately larger than IoBx. The closed loop signal path for this action is through amplifier A1, which at its output drives current sources Q1, and Q2 that in turn generate the high speed slave chain 370 (HSS) and DC control loop chain 372 (DCCL) currents $I_{GAIN}$ and $I_{GAINX}$, respectively. These currents are inversely proportional to Io and IoB differential current levels, thus at maximum output current differential, $I_{GAIN}$ and $I_{GAINX}$ are at 0. The DC differential feedback path is closed through DC output stage 384 current output Iox and the combination of $R_1$ and $R_2$ gain setting resistors as well as I1 offset current source. In this illustrative embodiment of the present invention, the relationship between output currents Iox and IoBx and output currents Io and IoB is that output currents Iox and IoBx are equal to Io/10 and IoB/10 respectively. As previously discussed, the currents and device sizes in the HSS chain 370 are ten times the size of their counterparts in the DCCL chain 372.

The output current summation, namely Io+IoB, is controlled by holding the IoBx output current of the DCCL chain 372 equal to that of the I2 current source. Amplifier A2, through identical current sources formed by transistor Q3 and Q4, generates feedback currents Icomp/10 that regulate the DC output stage's compliance current sources. Current sources formed by transistors Q5 and Q6 provide ratioed currents, Icomp, to the high speed slave chain's 370 output stage as well. If I1 is adjusted to the same current as I2, and if $I_{IN}$=0 mA, this will result in the differential between output currents Io and IoB to be 0, both Iox and IoBx will be equal to currents I1 and I2. If the Iox–IoBx differential is increased, Iox will remain at its fixed value set by I2 and the amplifier A2 by the feedback current Icomp/10. The output current Iox will increase in proportion to $I_{IN}$ and the gain set resistors $R_1$ and $R_2$. The currents of the output stage of the high speed slave chain 370 will be proportional to the currents from the output stage of the DC control loop chain 372. Unlike the fixed logic state of the current outputs of the output stage of the DC control loop chain 372, the current outputs of high speed slave chain 370 will reverse states in response to input logic stimulus. For example, the lower of either Iox or IoBx currents will remain constant regardless of output level programmed of the output stage of the DCCL chain 372.

Figure 8:
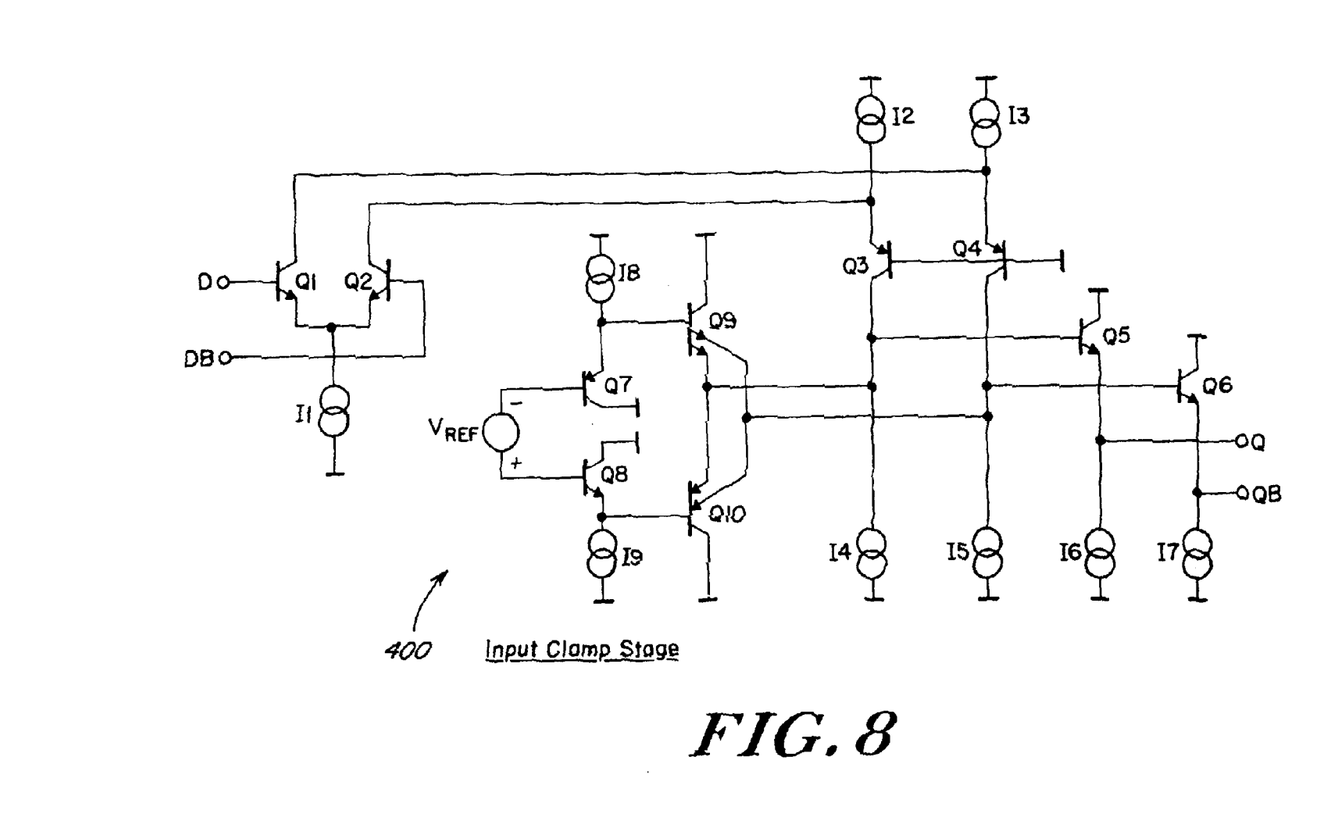
FIG. 8 is a more detailed schematic diagram of the input clamp stage of the high speed slave and DC control loop chains.

FIG. 8 illustrates a more detailed schematic of the input clamp stage of the high speed slave (HSS) chain 370 and DC control loop (DCCL) chain 372. As stated previously, the input clamp stage of the HSS chain 370 and DCCL chain 372 converts differential logic signals at inputs D and DB into fixed amplitude complimentary output voltages Q and QB. The transistors Q1 and Q2 receive the input signals D and DB at their respective bases. The arrangement of the transistors Q1 and Q2 form a differential switched pair that steers current from source I1 away from the current supplied by sources I2 and I3 to folded cascode transistors Q4 and Q3, respectively. The current sources I2 and I3 are each set to deliver more than the current available from current source I1 to insure that transistors Q3 and Q4 always remain actively biased. Thus, transistors Q3 and Q4 always remain actively biased. The collector current of transistor Q3 is either equal to the current from the current source I2, such that the input D is a logical high value and the input DB is a logical low value. This current is equal to the difference of the currents from current sources I1 and I2 the input D is a logical low and DB is a logical high. The collector current of transistor Q4 is complimentary to that of transistor Q3. Current sources I4 and I5 provide pull down current such that the collector node voltages of transistors Q3 or Q4 will rise if no current is being diverted by Q1 or Q2. Current sources I1, I2, I3, I4, and I5 are selected so that the resultant voltage rise and fall times of the collectors of transistors Q2 and Q3 will be equal. The absolute level of these current sources sets the slew rate as dV/dT=I/C, where C is the total capacitance of these collector nodes.

Transistors Q7 and Q9 form the negative clamp and transistors Q8 and Q10 form the positive clamp. The voltage Vref sets the clamp voltage differential. In the case, 0.4 V keeps the signal swing small enough for limited voltage headroom constraints, while at the same time keeping either transistors Q9 or Q10 from leaking emitter current when cutoff. This condition affects both slew rate and the voltage transition linearity. Transistors Q5 and Q6 buffer the high impedance collector nodes from the following current controlled gain stage differential pair. Transistors Q9 and Q10 are specifically sized so that they present a very low clamp point impedance to the bases of transistors Q5 and Q6 which keeps them from ringing. Matched, scaled, fixed voltage circuitry is contained in the DC input clamp stage.

In the DCCL, the input clamp stage 380 receives fixed logic input D and DB. Thus the input clamp stage 380 of the DCCL chain 372 also outputs fixed amplitude complimentary output voltages.

The complimentary output voltages Q and QB of the input clamp stage 380 demonstrate linear and matched rise and fall times with very low aberrations and fixed amplitude. The quality of the output signals Q and QB of the input clamp stage 380 is directly representative of the quality of the pin driver output waveform as from this stage forward, all amplification and gain control is linear.

Figure 9:
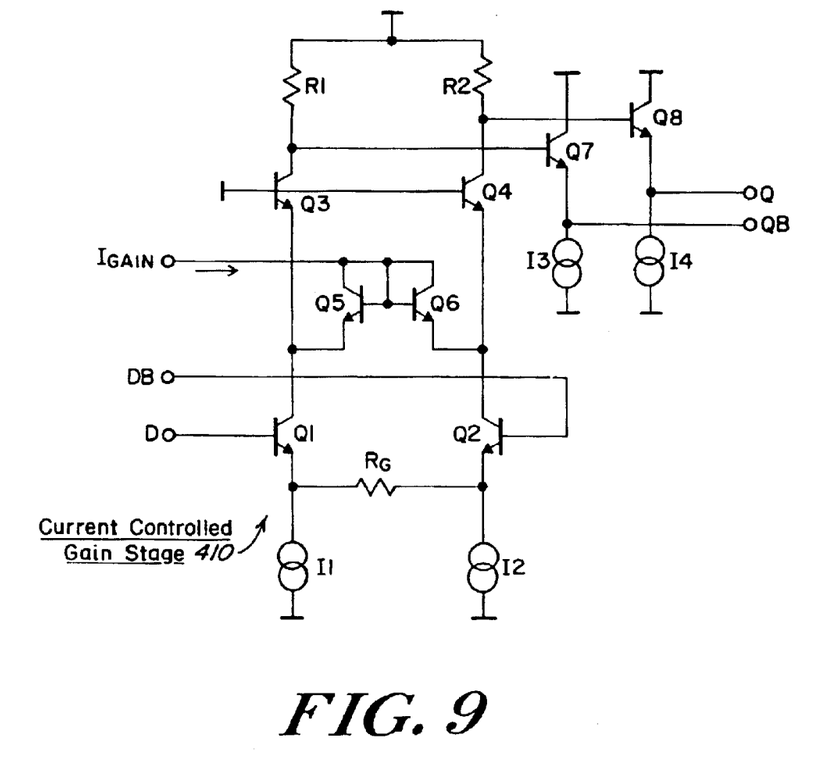
FIG. 9 is a more detailed schematic diagram of the current controlled gain stage of the high speed slave and DC control loop chains.

FIG. 9 illustrates a detailed schematic of the current controlled gain stage of the high speed slave (HSS) chain 370 and DC control loop (DCCL) chain 372. The complimentary outputs Q and QB of the input clamp stage drive the inputs D and DB of the current controlled gain stage (CCGS) 410 with a fixed amplitude voltage signal. The CCGS 410 employs a controlled cascode translinear multiplier cell configuration to provide wide bandwidth with high DC precision and low distortion means for controlling the amplitude of the fixed amplitude voltage signal. Traditionally, pin drivers have been limited to minimum output pulse amplitudes in the range of 100 to 200 mV due to their ability to provide for low distortion large and small signal pulses with the same circuit configuration. Variable clamp circuits have been used, but these are typically constrained by their inability to provide for linear performance as signal amplitudes are reduced to point that bipolar emitter/base junctions are not reverse biased enough to fully turn them off. Variable clamps also result in signal propagation delay changes that are proportional to signal amplitude.

Also, FIG. 9 further illustrates that components Q1, Q2, Q3, Q4, Rg, R1, R2, I1 and I2 form a standard cascoded differential amplifier with fixed transresistance. To control the gain of such a circuit requires adding two diode-connected transistors Q5 and Q6 whose emitter areas have been made equal to Q3 and Q4. A DC gain control current $I_{GAIN}$ is presented to the common collector/base points of these devices. In a maximum gain condition, Igain is set to 0 and transistors Q5 and Q6 are off, thus making the circuit perform as if they were not present. The transresistance is hence Rg. For minimum gain, Igain is now made equal to sum of the current from sources I1 and I2. In this condition, all of the current supplied by current sources I1 and I2 is diverted from transistors Q3 and Q4 by transistors Q5 and Q6. Essentially, no current flows through collector load resistors R1 and R2 so that the output is effectively off. For settings of the current $I_{GAIN}$ between 0 and the sum of the currents from current sources I1 and I2, the transresistance of the cell is $R_g/1-I_{GAIN}/(I1+I2)$. With the correct device size matching of the internal of CCGS 410, the CCGS 410 offers a very linear gain control while maintaining high signal integrity. High frequency feedthrough from Q1 and Q2 at minimum gain settings is also extremely low due to isolation provided by cascode transistors Q3 and Q4. Stage timing delay dependence is also eliminated by this arrangement. Small and large signal characteristics are essentially the same in this configuration, as well as, the DC accuracy is also maintained for the DC control loop chain 372.

Emitter followers Q7 and Q8 provide for a low impedance base drive for the output stage via output ports Q and QB.

Figure 10:
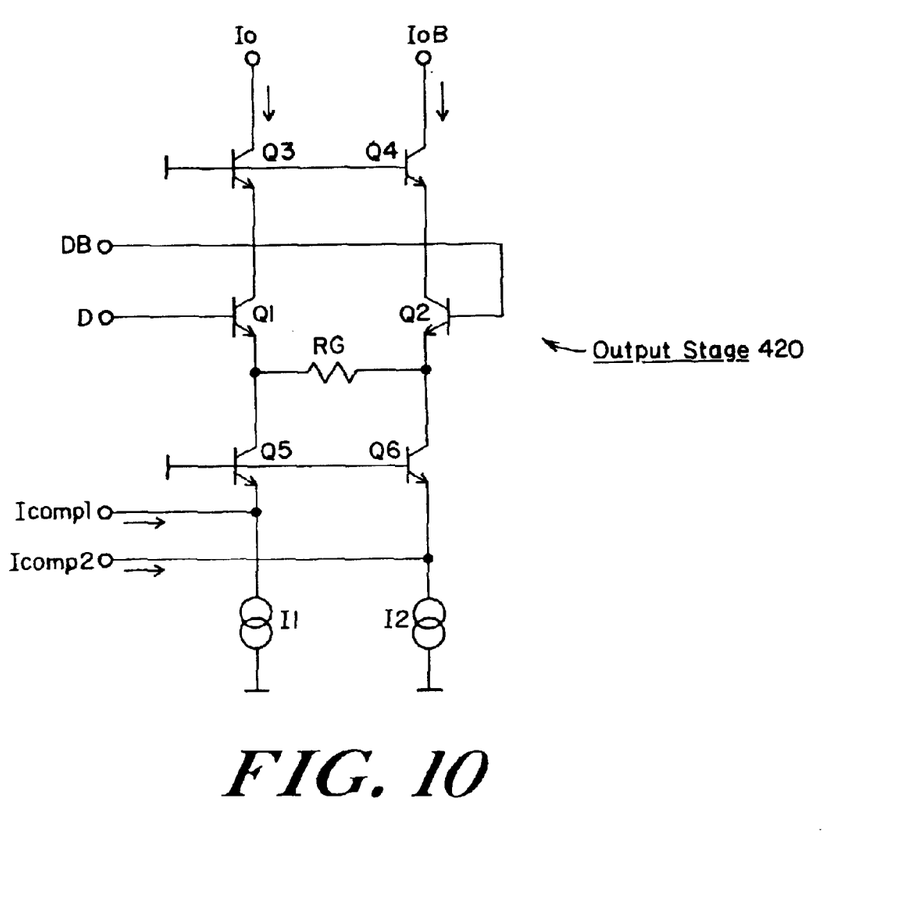
FIG. 10 is a more detailed schematic diagram of the output stage of the high speed slave and DC control loop chains.

FIG. 10 illustrates a detailed schematic of the output stage of the HSS chain 370 and the DCCL chain 372. The output stage 420 is a standard cascoded differential linear amplifier whose output currents, Io and IoB, drives either the driver output resistor $R_{OUT}$ in the case of the HSS chain 370, or provides feedback currents for the DCCL chain 372. In order to provide sufficient voltage across $R_{OUT}$ in the illustrative embodiment, HSS chain 370 current sources I1 and I2 are sized to 36 mA each. This current level enables the driver to provide a 1.5 V output swing with the DUT terminated into 50 Ohms. This amplitude level requires 60 mA of Io to IoB differential current swing, the remaining current is used to make sure neither transistor Q1 or Q2 goes into cut-off at high signal swings, and that the feedback loop regulation of the output stage 410 compliance current flowing through transistors Q5 and Q6 via ports Icomp1 and Icomp2 will always be active. The cascoded transistors Q3 and Q4 provide for high stage bandwidth and provide for higher voltage swings at the output Q and QB. Lower cascoded transistors Q5 and Q6 isolate the high capacitance of feedback input Icomp1 and Icomp2 from the high speed emitter voltage swings of transistors Q1 and Q2.

The output stage 384 of the DCCL chain 372 is identical in its structure but, as stated above, is scaled to 1/10 the currents and device sizes of the output stage of HSS chain 370. As in the HSS chain 370, cascode transistors Q3 and Q4 provide for high stage bandwidth and provide for higher voltage swings at the output. Lower cascode devices Q5 and Q6 isolate the high capacitance of feedback input Icomp1 and Icomp2 from the speed emitter voltage swings of input transistors Q1 and Q2.

Figure 11:
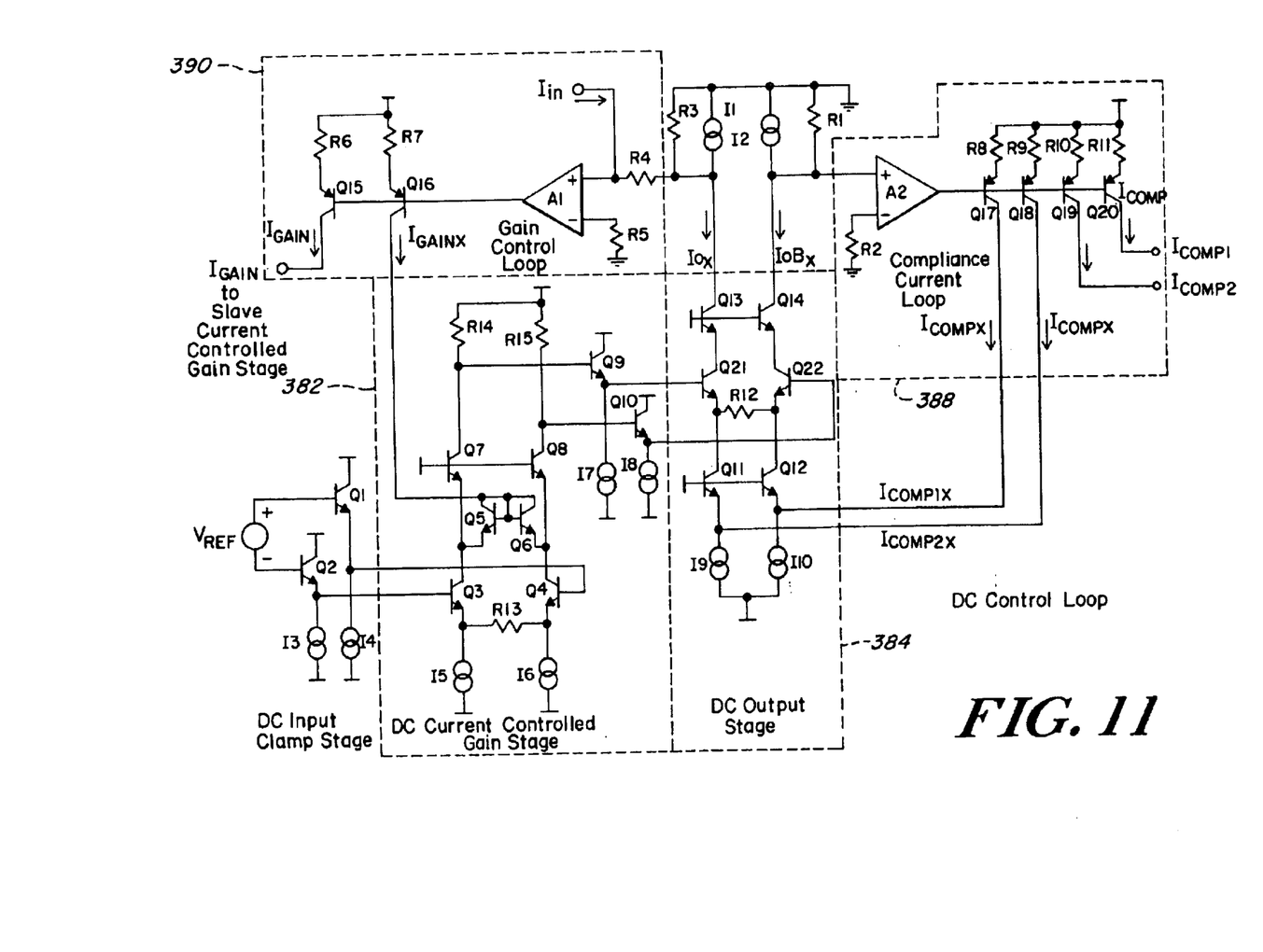
FIG. 11 is a schematic diagram of the DC control loop chain.

FIG. 11 illustrates a detailed schematic of the DC loop control (DCCL) chain. The DCCL chain 372 has only one input, Iin that is used to adjust the difference between output currents Iox and IoBx. DCCL chain 372 includes two feedback paths that provide for regulation of the difference between the output currents Iox and IoBx and the sum of the output currents Iox an IoBx. These loops are called the gain control loop 390 (GCL) and compliance current loop 388 (CCL), respectively. The GCL 390 is directly controlled by sourcing current into the Iin port. The current source for Iin is typically a digital to analog converter (DAC) with an output voltage compliance range that includes 0 V. The high gain amplifier A1 has its inverting input connected to ground. Under this condition, the high gain amplifier A1 will force the voltage at input Iin to equal the voltage on its inverting input. If it is assumed that the CCL 388 is not connected at this time, fixed equal current sources I9 and I10 pull all of their current through the cascoded transistors Q11 and Q12. Thus, the sum of currents from current sources I9 and I10 will be equal to the sum of output currents Io and IoB.

The Vref of the DCCL chain 372 is a fixed voltage source that drives the emitter follower transistors Q1 and Q2, which in turn impose this voltage between the bases of transistors Q3 and Q4 in the CCGS chain 382. Neglecting for the moment gain control transistors Q5 and Q6, this voltage is amplified and appears as a voltage differential at the collectors of transistors Q7 and Q8. Transistors Q9 and Q10 form emitter followers that buffer this signal and drive the bases of the output stage transistor Q21 and Q22 of the DCCL chain 372. Note, because of the polarity of Vref, the base of the transistor Q21 is higher than that of Q22. This causes more current to flow into Iox than IoBx. The collector current from either transistors Q11 or Q12 must always be greater than the difference voltage between Q21 and Q22 bases divided by resistor R12 to keep the input clamp stage in linear operation.

In the closed loop arrangement, it is assumed that an output current flows into Io. This current is drawn through fixed offset current source I1 as well as R3 and R4. Control current Iin will flow through resistor R4, where the top portion of resistor R4 is held at 0 V at the non-inverting input of amplifier A1. The voltage impressed across resistor R4 will be mirrored across resistor R3 whose other terminal is also connected to 0 V. As Iin increases, the output voltage of the amplifier A1 moves higher, thus reducing the current through cascoded transistors Q7 and Q8. This effectively increases the gain of the CCGS chain. A higher voltage differential appears across the collector of transistors Q7 and Q8 that causes the base differential voltage of transistors Q21 and Q22 to increase. More current then flows into Iox and less into IoBx. The increased Iox current then counters the increased current in Iin at the amplifier A1's non-inverting input summing node. The current gain of this loop is set by R3 and R4, where:

$$Io=Iin(1+R4/R3)$$

As mentioned previously, a major difference between the DCCL chain 372 and HSS chain 370 is that the DCCL chain 372 has a fixed, unipolar voltage reference at its input while the HSS chain 370 has a differential logic signal that reveres polarity. This results in the fact that while the DC output can only provide for its output current Iox to be greater than or equal to output current IoBx. The HSS chain 370 will have Iox greater or equal to IoB when its logic inputs have D high and DB low and IoBx greater than or equal to Io when D is low and DB is high. This infers that in this logic state the HSS chain 370 outputs currents Io and IoB will directly match their DCCL chain 372 counterparts Iox and IoBx, respectively. In the other logic state, the HSS chain 370 output current Io will match the DCCL chain 372 counterpart IoBx and the HSS chain 370 output IoB will match to the DC counterpart Iox. Thus, it is perfectly acceptable to have one of the two output currents kept at a fixed value. In switched current Class A drivers, only the VL low level output voltage moves in response to amplitude control. This is because the only time current is flowing through Rout in a switched architecture is when the driver output is in the higher current, VL output state. When the driver output is in a VH high state, no current is flowing through Rout, therefore the VH level is set by the High Current Buffer only and remains the same irregardless of the output current that the switched current driver is supplying. In a linear Class A output stage 378 of the HSS chain 370, current is always flowing through Io and IoB outputs, therefore both must be regulated.

The current compliance loop (CCL) 388 functions to regulate the IoB output current of the DCCL chain 372 output stage to a fixed value, independent of Iin current level. Current IoBx has been set to be less than or equal to currents Iox in the DCCL chain 372 and this will reflect a fixed voltage for Driver VH output voltage level. Since current IoBx is held constant while Io increases in response to an increased input current Iin, then the collector current of transistors Q11 and Q12 must increase as well. If current source I2 is set for the minimum value of current IoBx that is required and current sources I9 and I10 can provide more than the maximum current required by Iox and IoBx, then the high gain amplifier A2, through current sources formed by transistors Q17 and Q18, will adjust feedback currents Icomp1 and Icomp2 so that current IoBx will exactly equal to current from current source I2. As current Iin is increased or decreased, the compliance currents from collectors of transistors Q11 and Q12 will increase or decrease, respectively. In practice, current source I1 and I2 are equal, their absolute values set to keep enough current in the output stage at low signal amplitudes so that neither Q21 or Q22 will ever be allowed to go into cutoff. Like the gain control loop, scaled Icomp1 and Icomp2 feedback currents are also sent to control the HSS chain 370 output stage 376 from current sources formed by transistors Q19 and Q20.

While this invention has been particularly shown and described with references to preferred embodiments thereof, it will be understood by those skilled in the art that various changes in form and details may be made therein without departing from the spirit and scope of the invention as defined by the appended claims.

What is claimed is:

1. A circuit testing apparatus comprising:
   a controller for controlling signals being transferred between a circuit under test and the circuit testing apparatus; and
   a driver circuit for generating signals to be applied to the circuit under test, the driver circuit includes a high speed slave chain and a DC control loop chain coupled to the circuit under test, the high speed slave chain receives a differential voltage logic pulse train and converts said logic pulse train into an high speed current steering for producing said drive signal to be applied to the circuit under test, the DC control loop chain provides feedback paths for DC regulation of inputs of said high speed slave chain.

2. The circuit testing apparatus of claim 1, wherein the driver is a class A driver.

3. The circuit testing apparatus of claim 1, wherein the driver circuit is coupled to a pin on the circuit under test.

4. The circuit testing apparatus of claim 1, further comprising a receiver circuit for receiving output signals from the circuit under test.

5. The circuit testing apparatus of claim 4, wherein the receiver circuit is coupled to a pin on the circuit under test.

6. The circuit testing apparatus of claim 4, wherein the receiver circuit and the driver circuit are coupled together to a pin on the circuit under test.

7. The circuit testing apparatus of claim 1, wherein the high speed slave chain further includes an input clamp stage for receiving said differential logic pulse train and converting said differential logic pulse train into fixed amplitude complimentary output voltages.

8. The circuit testing apparatus of claim 1, wherein the DC control loop chain further includes an input clamp stage for receiving fixed differential logic signals and converting said fixed differential logic pulse train into fixed amplitude complimentary output voltages.

9. The circuit testing apparatus of claim 8, wherein the high speed slave chain and DC control loop chain further include a current controlled gain stage for receiving fixed amplitude complimentary output voltages of the input clamp stage and employing a controlled cascode translinear multiplier cell configuration to provide a wide bandwidth with high DC precision and low distortion means of controlling the amplitude.

10. The circuit testing apparatus of claim 9, wherein the high speed slave chain and DC control loop further includes an output stage that is a standard cascaded differential linear amplifier.

11. The circuit testing apparatus of claim 10, wherein the output stage of the high speed slave chain whose output currents drive an output resistor of the said driver circuit.

12. The circuit testing apparatus of claim 10, wherein the output stage of DC control loop chain provides feedback currents to DC control loop chain.

13. The circuit testing apparatus of claim 9, wherein the second pair of transistors are bipolar junction transistors.

14. The circuit testing apparatus of claim 1, wherein the high speed slave chain and DC control loop chain further comprises an output stage that includes a differential-input pair of transistors, where each transistor receives a differential current as input to drive the output stage.

15. The circuit testing apparatus of claim 14, wherein the output stage further includes a second pair of transistors, where each of said second pair of transistors receives a single-ended voltage input.

16. The circuit testing apparatus of claim 15, output stage further includes a resistance coupled between the second pair of transistors.

17. The circuit testing apparatus of claim 15, the output stage further includes a pair of current sources coupled to the second pair of transistors, each of the current sources driving a respective current through a respective one of the second pair of transistors.

18. A circuit testing apparatus comprising:

controlling means for controlling signals being transferred between a circuit under test and the circuit testing apparatus; and driving means for generating signals to be applied to the circuit under test, the driver circuit includes a high speed slave chain and a DC control loop chain coupled to the circuit under test, the high speed chain circuit receives a differential voltage logic pulse train and converts said logic pulse train into an high speed current steering for producing said drive signal to be applied to the circuit under test, the DC control loop chain provides feedback paths for DC regulation of inputs of said high speed slave chain.

19. The circuit testing apparatus of claim 18, wherein the driver is a class A driver.

20. The circuit testing apparatus of claims 18, wherein the driver circuit is coupled to a pin on the circuit under test.

21. The circuit testing apparatus of claim 18 further comprising a receiver circuit for receiving output signals from the circuit under test.

22. The circuit testing apparatus of claim 21, wherein the receiver circuit is coupled to a pin on the circuit under test.

23. The circuit testing apparatus of claim 21, wherein the receiver circuit and the driver circuit are coupled together to a pin on the circuit under test.

24. The circuit testing apparatus of claim 18, wherein the high speed slave chain further includes an input clamp stage for receiving said differential logic pulse train and converting said differential logic pulse train into fixed amplitude complimentary output voltages.

25. The circuit testing apparatus of claim 18, wherein the DC control loop chain further includes an input clamp stage for receiving fixed differential logic signals and converting said fixed differential logic pulse train into fixed amplitude complimentary output voltages.

26. The circuit testing apparatus of claim 25, wherein the high speed slave chain and DC control loop chain further include a current controlled gain stage for receiving fixed amplitude complimentary output voltages of the input clamp stage and employing a controlled cascode translinear multiplier cell configuration to provide a wide bandwidth with high DC precision and low distortion means of controlling the amplitude.

27. The circuit testing apparatus of claim 26, wherein the high speed slave chain and DC control loop further includes an output stage that is a standard cascoded differential linear amplifier.

28. The circuit testing apparatus of claim 27, wherein the output stage of the high speed slave chain whose output currents drive an output resistor of the said driver circuit.

29. The circuit testing apparatus of claim 28, wherein the output stage of DC control loop chain provides feedback currents to DC control loop chain.

30. The circuit testing apparatus of claim 18, wherein the high speed slave chain and DC control loop chain further comprises an output stage that includes a differential-input pair of transistors, where each transistor receives a differential current as input to drive the output stage.

31. The circuit testing apparatus of claim 30, wherein the output stage further includes a second pair of transistors, where each of said second pair of transistors receives a single-ended voltage input.

32. The circuit testing apparatus of claim 31, output stage further includes a resistance coupled between the second pair of transistors.

33. The circuit testing apparatus of claim 32, the output stage further includes a pair of current sources coupled to the second pair of transistors, each of the current sources driving a respective current through a respective one of the second pair of transistors.

34. The circuit testing apparatus of claim 30, wherein the second pair of transistors are bipolar junction transistors.

35. A method of testing a circuit, comprising:

providing a controller for controlling signals being transferred to and from the circuit under test;

providing a driver circuit coupled to the circuit under test;

receiving a differential voltage logic pulse train;

converting said logic pulse train into a high speed current steering for producing a drive; and performing testing of said circuit under test using said signal.

36. The circuit testing apparatus of claim 35, where the driver circuit is a class A driver.

37. The circuit testing apparatus of claim 36, wherein receiving said differential logic pulse train further includes converting said differential logic pulse train into fixed amplitude complimentary output voltages.

38. The circuit testing apparatus of claim 36, comprising receiving fixed differential logic signals and converting said fixed differential logic pulse train into fixed amplitude complimentary output voltages.

39. The circuit testing apparatus of claim 38, further comprising receiving fixed amplitude complimentary output voltages and employing a controlled cascode translinear multiplier cell configuration to provide a wide bandwidth with high DC precision and low distortion means of controlling the amplitude.

40. The circuit testing apparatus of claim 38, wherein the driver circuit further includes a standard cascoded differential linear amplifier.

41. The circuit testing apparatus of claim 35, wherein the driver circuit is coupled to a pin on the circuit under test.

42. The circuit testing apparatus of claim 35, further providing a receiver circuit for receiving output signals from the circuit under test.

43. The circuit testing apparatus of claim 42, wherein the receiver circuit is coupled to a pin on the circuit under test.

44. The circuit testing apparatus of claim 43, wherein the receiver circuit and the driver circuit are coupled together to a pin on the circuit under test.

* * * * *